(12) United States Patent
Wu et al.

(10) Patent No.: US 12,205,634 B2
(45) Date of Patent: Jan. 21, 2025

(54) ELECTRONIC CIRCUITS, MEMORY DEVICES, AND METHODS FOR OPERATING AN ELECTRONIC CIRCUIT

(71) Applicant: TAIWAN SEMICONDUCTOR MANUFACTURING COMPANY LTD., Hsinchu (TW)

(72) Inventors: Wei-Cheng Wu, Hsinchu (TW); Pei-Yuan Li, New Taipei (TW); Kao-Cheng Lin, Taipei (TW); Chien Hui Huang, Tainan (TW); Yung-Ning Tu, Changhua (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 166 days.

(21) Appl. No.: 17/672,312

(22) Filed: Feb. 15, 2022

(65) Prior Publication Data
US 2023/0260572 A1 Aug. 17, 2023

(51) Int. Cl.
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC .... G11C 11/419; G11C 11/412; G11C 11/418
See application file for complete search history.

(56) References Cited

U.S. PATENT DOCUMENTS

| | | | |
|---|---|---|---|
| 7,505,345 B2* | 3/2009 | Wang | G11C 11/418 365/207 |
| 8,391,097 B2* | 3/2013 | Chan | G11C 8/08 365/189.11 |
| 8,593,859 B2* | 11/2013 | Agari | G11C 5/14 365/229 |
| 9,064,550 B2* | 6/2015 | Chang | G11C 11/418 |
| 9,082,507 B2* | 7/2015 | Holla | G11C 7/02 |
| 2017/0110164 A1* | 4/2017 | Cheng | G11C 7/10 |
| 2017/0287551 A1* | 10/2017 | Sahu | G11C 8/08 |

* cited by examiner

*Primary Examiner* — Khamdan N. Alrobaie
(74) *Attorney, Agent, or Firm* — WPAT LAW; Anthony King

(57) ABSTRACT

The present disclosure provides an electronic circuit, a memory device, and a method for operating an electronic circuit. An electronic circuit comprises a driver circuit configured to provide a drive voltage to a word line of the electronic circuit, a suppression circuit electrically connected to the driver circuit and the word line, and a control circuit electrically connected to the suppression circuit. The suppression circuit is configured to generate a voltage drop in the drive voltage. The control circuit controls the suppression circuit.

20 Claims, 7 Drawing Sheets

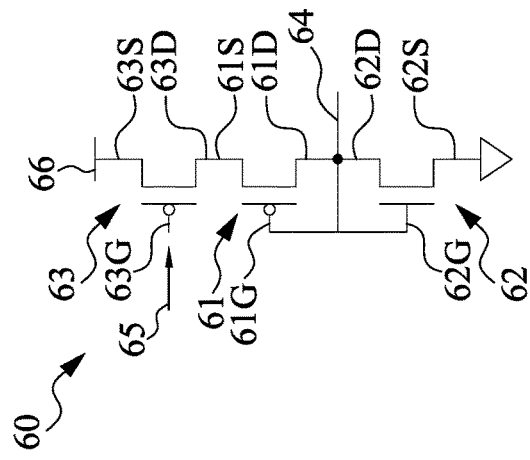
FIG. 5
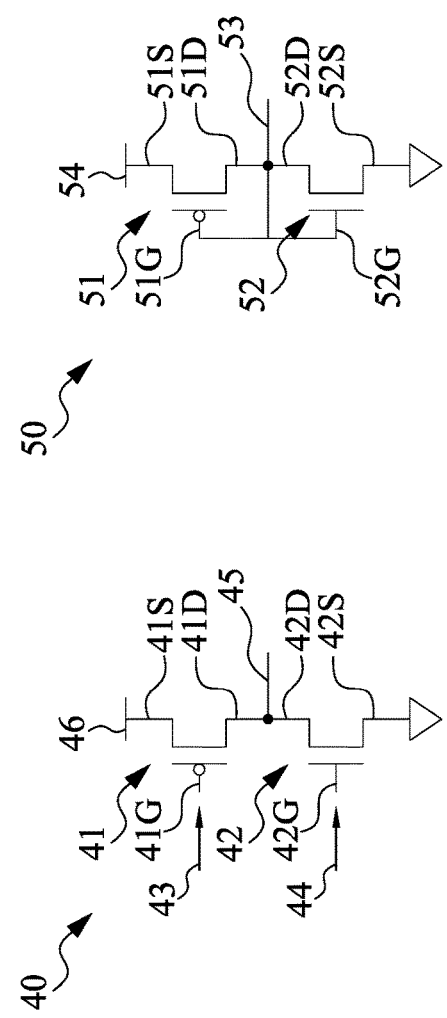
FIG. 4
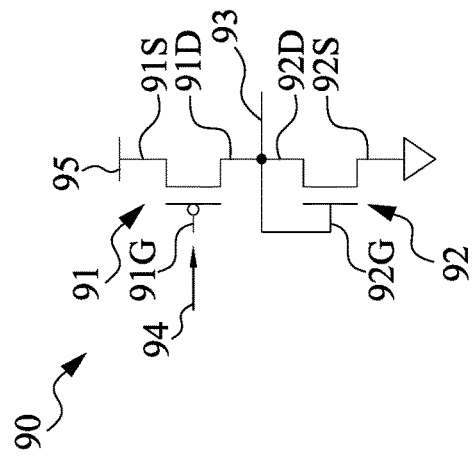
FIG. 6
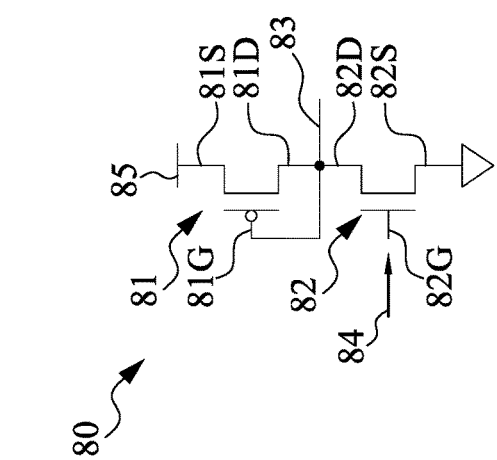
FIG. 8
FIG. 9
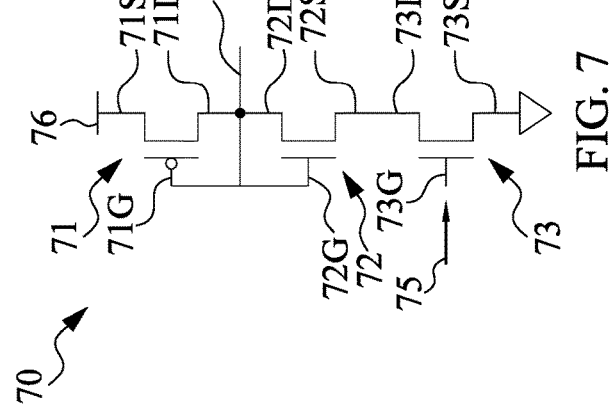
FIG. 7

ELECTRONIC CIRCUITS, MEMORY DEVICES, AND METHODS FOR OPERATING AN ELECTRONIC CIRCUIT

BACKGROUND

The present invention relates generally to electronic circuit design, and more particularly to electronic circuit design for suppressing voltage bumps in word lines.

Static random-access memory (SRAM) is a type of random-access memory that uses latching circuitry to store each bit. A SRAM device may use latching circuitry (flip-flop) to store each bit, SRAM is volatile memory, such that data is lost when power is removed. The term 'static' differentiates SRAM from DRAM (dynamic random-access memory), in which DRAM must be periodically refreshed. SRAM is faster and more expensive than DRAM; it is typically used for cache and internal registers of a Central Processing Unit while DRAM is used for main computer memory, SRAM provides simple data access requiring no refresh circuit. Performance and reliability of SRAM are good and power consumption is low when idle.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 4 illustrates a schematic diagram of an exemplary control circuit, in accordance with some embodiments of the present disclosure.

FIG. 5 illustrates a schematic diagram of an exemplary control circuit, in accordance with some embodiments of the present disclosure.

FIG. 6 illustrates a schematic diagram of an exemplary control circuit, in accordance with some embodiments of the present disclosure.

FIG. 7 illustrates a schematic diagram of an exemplary control circuit, in accordance with some embodiments of the present disclosure.

FIG. 8 illustrates a schematic diagram of an exemplary control circuit, in accordance with some embodiments of the present disclosure.

FIG. 9 illustrates a schematic diagram of an exemplary control circuit, in accordance with some embodiments of the present disclosure.

DETAILED DESCRIPTION

Figure 1:
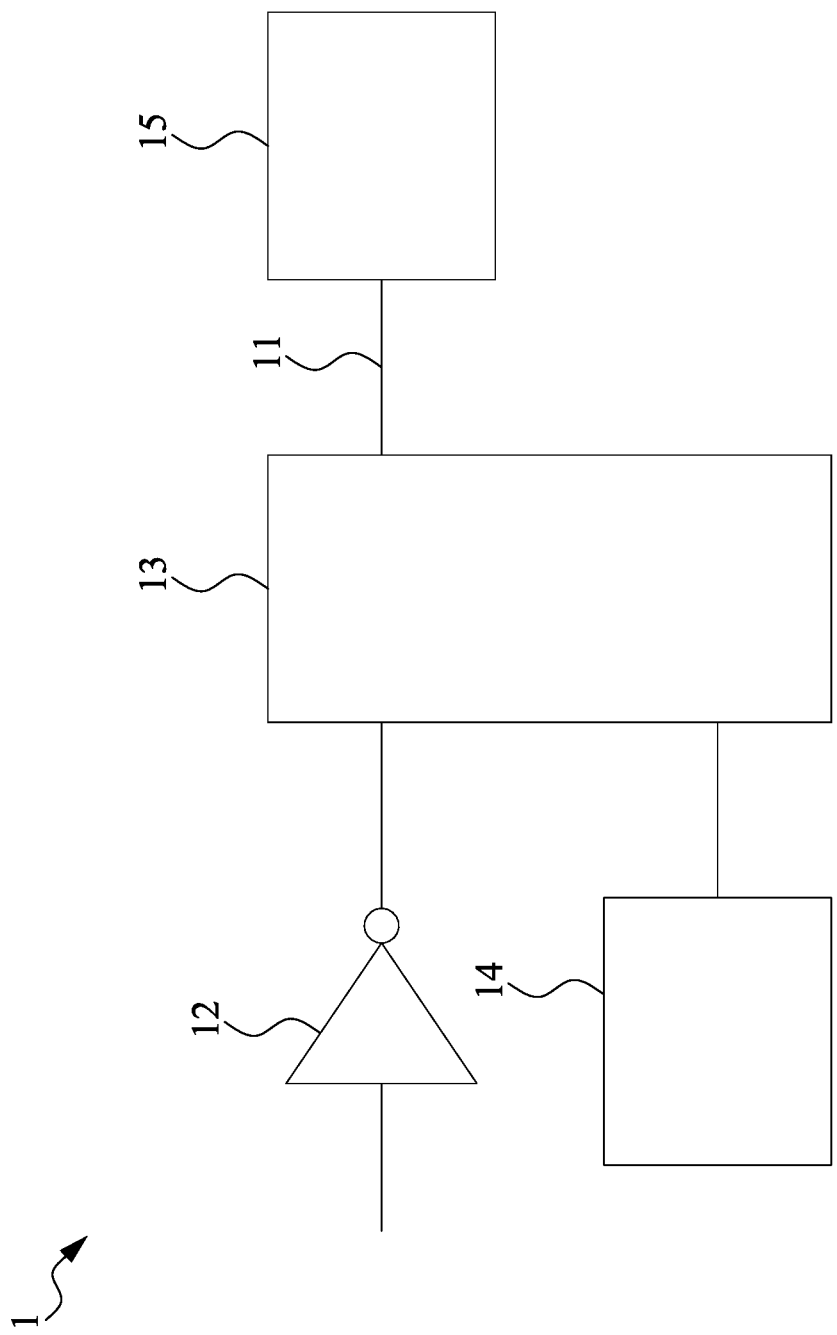
FIG. 1 illustrates a schematic diagram of an exemplary electronic device, in accordance with some embodiments of the present disclosure.

For a SRAM device, in a read or dummy read operation with bit line and bit line bar initially pre-charged high, when a word line rises, there will be a voltage bump on the storage node in the SRAM bit-cell which should maintain "0" during the read or dummy read operation. Once the voltage bump is higher than the latch trigger point, the internal state of the SRAM bit-cell will be flipped. This condition is referred to as a read disturbance.

Static direct current-resistant designs for semiconductor devices may be applied to suppress voltage bumps in word lines. However, such designs may cause over/bander voltage drops. The designs are inefficient and may induce further performance impairment, such as speed degradation, higher power consumption, and reduced process variation adaptability for the SRAM.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact in addition, the present disclosure may repeat reference numerals and/or letters in the various examples. This repetition is for the purpose of simplicity and clarity, and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a schematic diagram of an exemplary electronic device 1, in accordance with some embodiments of the present disclosure. The electronic device 1 comprises a word line 11, a driver circuit 12, a suppression circuit 13, a control circuit 14, and a SRAM device 15. The driver circuit 12 is configured to provide drive voltage to the word line 11 of the electronic device 1. The suppression circuit 13 is electrically connected to the driver circuit 12 and the word line 11. The suppression circuit 13 is configured to generate a voltage drop in the drive voltage of the word line 11. The control circuit 14 is electrically connected to the suppression circuit 13. The control circuit 14 controls the suppression circuit 13. The word line 11 controlled by the suppression circuit 13 is electrically connected to the SRAM device 15.

Figure 2:
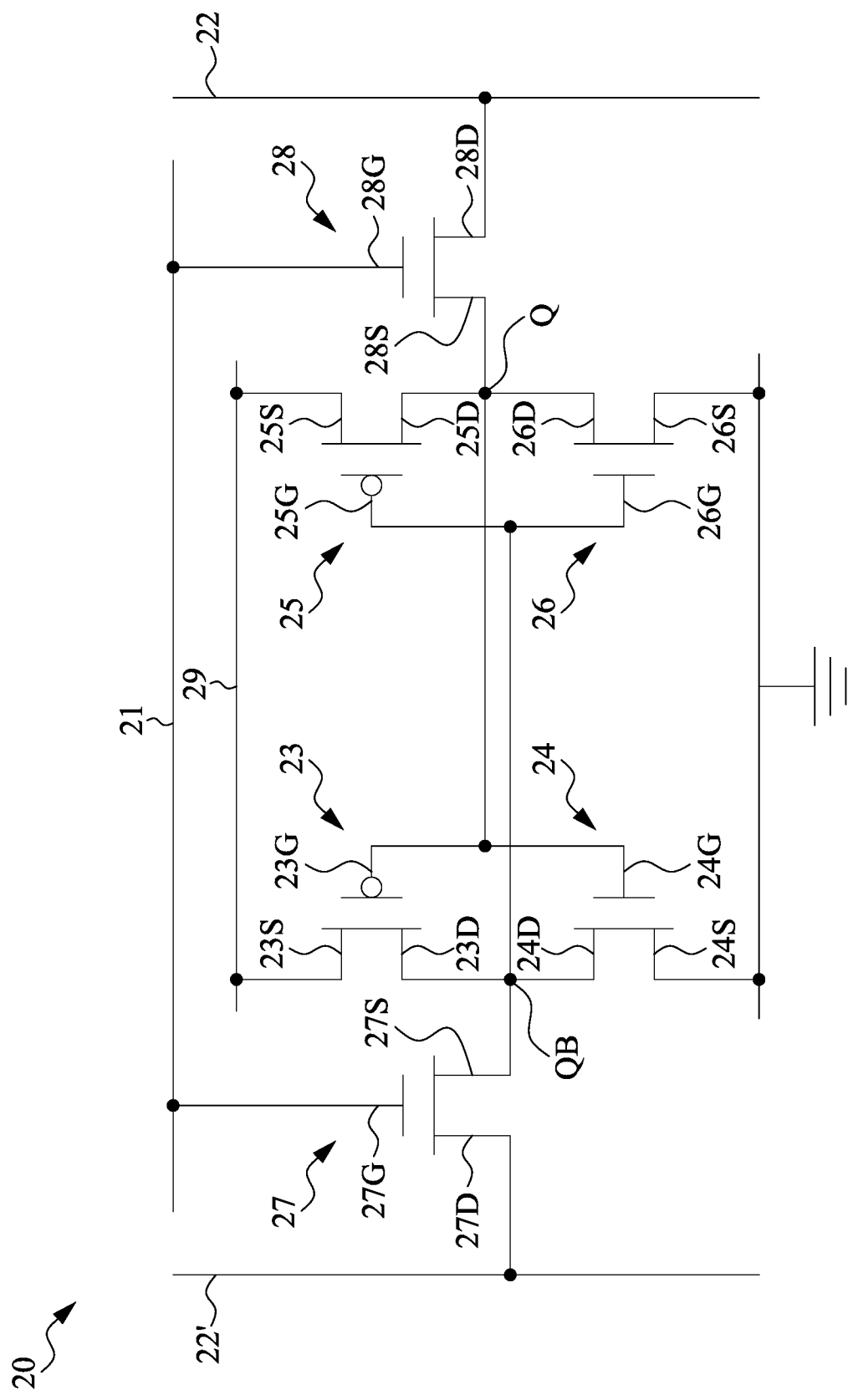
FIG. 2 illustrates a schematic diagram of an exemplary SRAM bit-cell, in accordance with some embodiments of the present disclosure.

FIG. 2 illustrates a schematic diagram of an exemplary SRAM bit-cell 20, in accordance with some embodiments of the present disclosure.

The SRAM bit-cell 20 is a cell of the SRAM device 15. The SRAM bit-cell 20 comprises a word line 21, a bit line 22, a bit line bar 22', and six transistors. The transistor of the SRAM bit-cell 20 may be metal-oxide-semiconductor field-effect transistors (MOSFET). In some embodiments, the SRAM bit-cell 20 comprises two p-type MOSFETs (PMOS) 23 and 25 and four n-type MOSFETs (NMOS) 24, 26, 27 and 28. The gate electrode 23G of the PMOS 23 is electrically connected to the gate electrode 24G of the NMOS 24. The drain electrode 23D of the PMOS 23 is electrically connected to the drain electrode 24I of the NMOS 24, The source electrode 23S of the PMOS 23 is electrically connected to a power source 29 (e.g., $V_{DD}$). The source electrode 24S of the NMOS 24 is electrically connected to the ground. The PMOS 23 and NMOS 24 form an inverter.

The gate electrode 25G of the PMOS 25 is electrically connected to the gate electrode 26G of the NMOS 26. The drain electrode 25D of the PMOS 25 is electrically connected to the drain electrode 26D of the NMOS 26. The source electrode 25S of the PMOS 25 is electrically connected to the power source 29 (e.g., $V_{DD}$). The source electrode 26S of the NMOS 26 is electrically connected to the ground. The PMOS 25 and NMOS 26 form an inverter.

The gate electrode 27G of the NMOS 27 is electrically connected to the word line 21. The drain electrode 27D of the NMOS 27 is electrically connected to the bit line bar 22'. The source electrode 27S of the NMOS 27 is electrically connected to the drain electrode 23D of the PMOS 23 and the drain electrode 24D of the NMOS 24. The source electrode 27S of the NMOS 27 is electrically connected to the inverter formed by the PMOS 23 and the NMOS 24. The gate electrode 28G of the NMOS 28 is electrically connected to the word line 21. The drain electrode 28D of the NMOS 28 is electrically connected to the bit line 22. The source electrode 28S of the NMOS 28 is electrically connected to the drain electrode 25D of the PMOS 25 and the drain electrode 26D of the NMOS 26. The source electrode 28S of the NMOS 28 is electrically connected to the inverter formed by the PMOS 25 and the NMOS 26.

A node QB electrically connects the drain electrode 23D of the PMOS 23 and the drain electrode 24D of the NMOS 24. The node QB is also electrically connected to the gate electrode 25G of the PMOS 25 and the gate electrode 26G of the NMOS 26. A node Q electrically connects the drain electrode 25D of the PMOS 25 and the drain electrode 26D of the NMOS 26. The node Q is also electrically connected to the gate electrode 23G of the PMOS 23 and the gate electrode 24G of the NMOS 24.

The SRAM bit-cell 20 has states of standby (the circuit is idle), reading (the data has been requested), or writing (updating the contents). The SRAM bit-cell 20 operated in read mode should have readability. The SRAM bit-cell 20 operated in the write mode should have write stability.

When the SRAM bit-cell 20 is in standby mode, the word line 21 is set to low. The two cross-coupled inverters formed by the POMS 23 and NMOS 24 and the POMS 25 and NMOS 26 are disconnected from the bit line 22 and the bit line bar 22' by the NMOS 27 and 28. The data stored in the nodes Q and QB are kept.

When the data stored in the SRAM bit-cell 20 is "1," the data stored in the node Q is "1" and the data stored in the node QB is "0." When the SRAM bit-cell 20 is in read mode, the bit line 22 and bit line bar 22' are set to a "high" logic state (i.e., data "1"). Afterwards, the word line 21 is set to a "high" logic state, such that the NMOS 27 and 28 are enabled. Because the data stored in the node Q is the same as the initial value of the bit line 22, the data stored in the node Q is maintained at "1". Because the data stored in the node Q is "1," the NMOS 24 is enabled and the PMOS 23 is disabled. This causes the data stored in the node QB to be "0." Since the NMOS 24 and the NMOS 27 are enabled, the bit line bar 22' is electrically connected to the ground, and thus has a data "0." Furthermore, because the data stored in the node QB is "0," the PMOS 25 is enabled and the NMOS 26 is disabled. This causes the data stored in the node Q to be "1." Since the PMOS 25 and the NMOS 28 are enabled, the bit line 22 is connected to the power source 29, and thus has a data "1".

If the data stored in the SRAM bit-cell 20 is "0," the data stored in the node Q is "0" and the data stored in the node QB is "1." When the SRAM bit-cell 20 is in read mode, the bit line 22 and bit line bar 22' are set to a "high" logic state (i.e., data "1"). Afterwards, the word line 21 is set to a "high" logic state, such that the NMOS 27 and 28 are enabled. Because the data stored in the node QB is the same as the initial value of the bit line bar 22', the data stored in the node QB is maintained at 1. Because the data stored in the node QB is "1," the PMOS 25 is disabled and the NMOS 26 is enabled. This makes the data stored in the node Q "0." Since the NMOS 26 and the NMOS 28 are enabled, the bit line 22 is electrically connected to the ground, and thus has data "0." Furthermore, because the data stored in the node Q is "0," the PMOS 23 is enabled and the NMOS 24 is disabled. This causes the data stored in the node QB to be "1." Since the PMOS 23 and the NMOS 27 are enabled, the bit line bar 22' is connected to the power source 29, and thus has a data "1."

In some embodiments, the SRAM bit-cell 20 may comprise more than six transistors. In some embodiments, the SRAM bit-cell 20 may comprise eight transistors. In some embodiments, the SRAM bit-cell 20 may comprise ten transistors.

Figure 3:
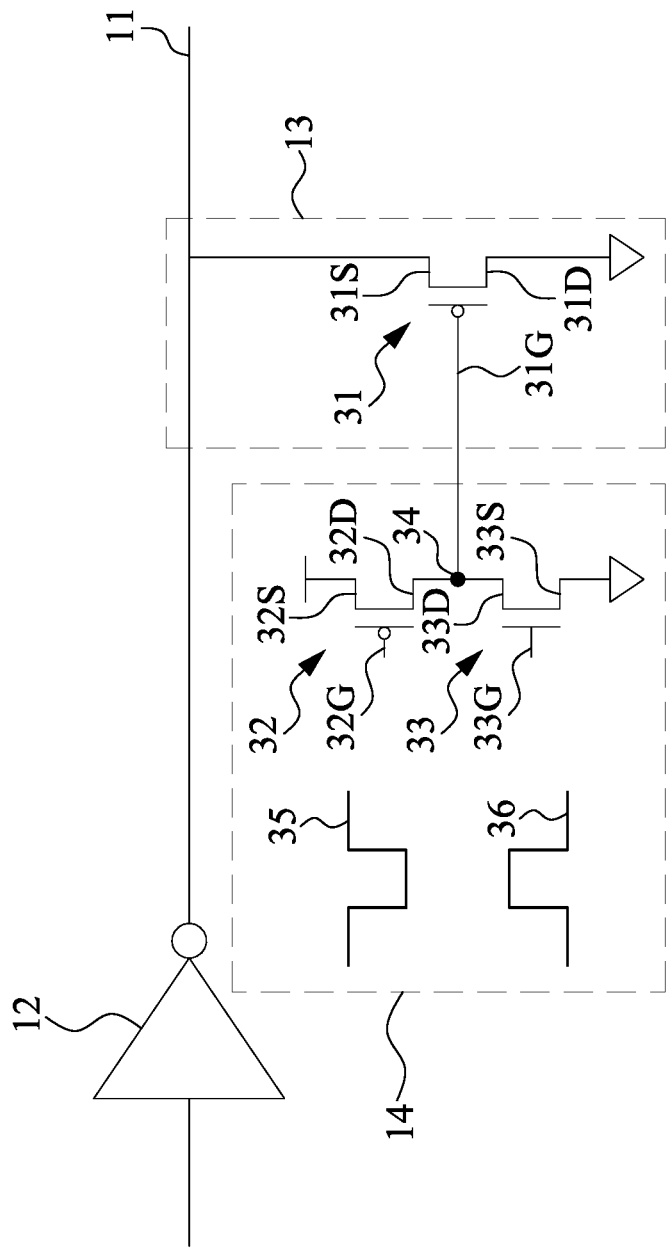
FIG. 3 illustrates a schematic diagram of an exemplary electronic circuit, in accordance with some embodiments of the present disclosure.

FIG. 3 illustrates a schematic diagram of an exemplary electronic circuit, in accordance with some embodiments of the present disclosure. FIG. 3 shows the driver circuit 12, the suppression circuit 13, and the control circuit 14.

The suppression circuit 13 comprises a transistor. The transistor of the suppression circuit 13 may be a metal-oxide-semiconductor field-effect transistor (MOSFET). The suppression circuit 13 may comprise a p-type transistor or a p-type MOSFET (PMOS) 31. The control circuit 14 comprises a p-type transistor or a p-type MOSFET (PMOS) 32 and an n-type transistor or a n-type MOSFET (NMOS) 33.

In some embodiments, the transistor of the suppression circuit 13 may be a n-type transistor, the upper transistor of the control circuit 14 may be an n-type transistor, and the lower transistor of the control circuit 14 may be a p-type transistor.

The control circuit 14 is electrically connected to the suppression circuit 13. The control circuit 14 controls the suppression circuit 13 to generate the voltage drop in the drive voltage of the word line 11. The source electrode 31S of the PMOS 31 is electrically connected to the word line 11 and the word line driver 12. The drain electrode 31D of the PMOS 31 is electrically connected to the ground. The gate electrode 31G of the PMOS 31 is electrically connected to the control circuit 14. The gate electrode 31G of the PMOS 31 is electrically connected to the drain electrode 32D of the PMOS 32 and the drain electrode 33D of the NMOS 33. The source electrode 32S of the PMOS 32 is electrically connected to a power source. The source electrode 33S of the NMOS 33 is electrically connected to the ground.

The PMOS 31 of the suppression circuit 13 may generate a voltage drop in the drive voltage of the word line 11. The size of the voltage drop is determined by control voltage applied to the gate electrode 31G of the PMOS 31 of the suppression circuit 13. The suppression circuit 13 adjusts the drive voltage of the word line 11. In some embodiments, the suppression circuit 13 decreases the drive voltage of the word line 11 based on the control voltage. In some embodiments, the control voltage applied to the gate electrode 31G of the PMOS 31 is determined based on a voltage difference caused by the PMOS 32 and a voltage difference caused by the NMOS 33. In some embodiments, the control circuit 14 is turned on based on the signal applied to the gate electrode 32G of the PMOS 32. In some embodiments, the control circuit 14 is turned on based on the signal applied to the gate electrode 33G of the NMOS 33. In some embodiments, the control circuit 14 is turned on based on one or more signals applied to at least one of the gate electrode 32G of the PMOS 32 or the gate electrode 33G of the NMOS 33. In some embodiments, the one or more signals comprise pulse signals.

The behavior of a MOSFET operated in a linear region is similar to a voltage-controlled resistor. For a PMOS operated in the linear region, if the gate voltage applied thereto is lower, the equivalent resistance of the PMOS may be correspondingly lower, and the drain current of the PMOS increased under a given voltage between the drain and the source. The equivalent resistance of a PMOS operated in the linear region may be inversely proportional to its carrier mobility. For example, if a PMOS used for the suppression circuit 13 generates a higher drain current, a larger voltage drop in the voltage of the word line may be caused. For a NMOS operated in a linear region, if the gate voltage applied thereto is higher, the equivalent resistance of the NMOS may be correspondingly lower, and the drain current of the NMOS increased under a given voltage between the drain and the source. The equivalent resistance of a NMOS operated in the linear region may be inversely proportional to its carrier mobility. For example, if a NMOS used for the suppression circuit 13 generates a higher drain current, a larger voltage drop in the voltage of the word line may be caused.

In some embodiments, if the NMOS 33 is weaker and the PMOS 32 is stronger (i.e., slow NMOS fast PMOS (SF) corner), the carrier mobility of the NMOS 33 may be lower and the carrier mobility of the PMOS 32 may be higher. If the NMOS 33 is weaker and the PMOS 32 is stronger (i.e., slow NMOS fast PMOS (SF) corner), the voltage difference generated by the PMOS 32 itself may be less. This may increase the voltage applied to the gate electrode 31G of the PMOS 31. When the voltage applied to the gate electrode 31G of the PMOS 31 increase, the equivalent resistance of the PMOS 31 (e.g., operated in linear region) may increase, and the drain current of the PMOS 31 lowered. Accordingly, less drop in the voltage of the word line may be incurred.

In some embodiments, if the NMOS 33 is stronger and the PMOS 32 is weaker (i.e., fast NMOS slow PMOS (FS) corner), the carrier mobility of the NMOS 33 may be higher and the carrier mobility of the PMOS 32 may be lower. If the NMOS 33 is stronger and the PMOS 32 is weaker (i.e., fast NMOS slow PMOS (FS) corner), the voltage difference generated by the PMOS 32 itself may be larger. This may reduce the voltage applied to the gate electrode 31G of the PMOS 31. When the voltage applied to the gate electrode 31G of the PMOS 31 reduces, the equivalent resistance of the PMOS 31 (e.g., operated in linear region) may decrease, and the drain current of the PMOS 31 may increase. Accordingly, the drop in the voltage of the word line may increase.

The word "fast" in the preceding paragraphs can refer to less time to achieve an "on" state, higher drain current, or less on-state impedance of the MOSFET. The word "slow" in the preceding paragraphs can refer to more time to achieve an "on" state, less drain current, or larger on-state impedance of the MOSFET.

The control circuit 14 may control the logic state of the PMOS 31 of the suppression circuit 13. The control circuit 14 may control the voltage applied to the gate electrode 31G of the PMOS 31 of the suppression circuit 13. A pulse signal 35 can be input to the gate electrode 32G, so as to control the PMOS 32 of the control circuit 14. A pulse signal 36 can be input to the gate electrode 33G, so as to control the NMOS 33 of the control circuit 14. By controlling the pulse signals 35 and 36, the PMOS 32 and NMOS 33 of the control circuit 14 can be dynamically or adaptively controlled. If the gate electrode 32G of the PMOS 32 of the control circuit 14 is subject to a "low" logic state or a low voltage and the gate electrode 33G of the NMOS 33 of the control circuit 14 is subject to a "high" logic state or a high voltage, the output 34 of the control circuit 14 will apply the corresponding voltage to the gate electrode 31G. Since the gate electrode 31G is subject to the corresponding voltage, the drive voltage of the word line 11 may drop accordingly. In some embodiments, the output 34 of the control circuit 14 may be about 0.2V to about 0.3V. In some embodiments, the voltage of the word line 11 may drop about 10%.

When performing a read operation, the word line 11 is set to a "high" logic state. This may cause a voltage bump at the storage node Q shown in FIG. 2. If the voltage bump at the storage node Q is higher than a latch trigger threshold, the data stored in the storage node Q may be flipped. If the voltage of the word line 11 can drop for a predetermined amount, the voltage bump at the storage node Q may be less than the latch trigger threshold. Accordingly, the read disturb of the SRAM bit-cell 20 shown in FIG. 2 is reduced.

If the gate electrode 32G of the PMOS 32 of the control circuit 14 is subject to a "high" logic state or a high voltage and the gate electrode 33G of the NMOS 33 of the control circuit 14 is subject to a "low" logic state or a low voltage, the output 34 of the control circuit 14 will not apply a voltage to the gate electrode 31G. Since the gate electrode 31G is not subject to voltage, the PMOS 31 of the suppression circuit 13 may be turned off. Accordingly, the voltage drop of the word line 11 may be minimal or none.

If the PMOS 32 of the control circuit 14 is in a "low" logic state and the NMOS 33 of the control circuit 14 is in a "high" logic state, the output 34 of the control circuit 14 depends on the reaction speeds of the PMOS 32 and NMOS 33. If the reaction speed of the NMOS 33 is higher than that of the PMOS 32, the output 34 of the control circuit 14 is closer to ground. The output 34 of the control circuit 14 is in a "low" logic state. This may cause the PMOS 31 to be closer achieving an "on" state, and cause a voltage drop of the word line 11. Accordingly, the read disturb of the SRAM bit-cell 20 may be reduced.

When performing a read operation on the electronic device 1, the word line 11 is set to a "high" logic state. There will be a voltage bump on the storage node Q in the SRAM bit-cell 20. The storage node Q should keep its logic state during the read operation. If the voltage bump is higher than latch trigger point, the internal state of SRAM bit-cell will be flipped. The suppression circuit 13 can generate a voltage drop in the voltage of the word line 11. The suppression circuit 13 can control the amount of the voltage drop in the voltage of the word line 11. The voltage bump formed on the storage node Q may be compensated by the voltage drop from the suppression circuit 13. Thus, the data stored in the SRAM bit-cell 20 is not flipped.

The control circuit 14 can optimize the voltage of the word line 11 by minimizing the over/under voltage drop of the word line 11. The control circuit 14 can tune the voltage drop in the voltage of the word line 11 automatically based on for process variations of the SRAM device 15 and/or the SRAM bit-cell 20. With the control circuit 14 the SRAM device 15 and/or the SRAM bit-cell 20 experience less speed degradation. With the control circuit 14, the SRAM device 15 and/or the SRAM bit-cell 20 reduce power consumption (e.g., due to the voltage drop in the voltage of the word line 11).

FIG. 4 illustrates a schematic diagram of an exemplary control circuit 40, in accordance with some embodiments of the present disclosure. The control circuit 40 includes one transistor of first type and one transistor of second type. The control circuit 40 comprises a PMOS 41 and an NMOS 42. The PMOS 41 comprises a gate electrode 41G, a drain electrode 41D, and a source electrode 41S. The NMOS 42 comprises a gate electrode 42G, a drain electrode 42D, and a source electrode 42S. A signal 43 is input to the gate electrode 41G of the PMOS 41. A signal 44 is input to the gate electrode 42G of the NMOS 42. The drain electrode 41D of the PMOS 41 is electrically connected to the drain electrode 42D of the NMOS 42. The output of the control circuit 40 is at the node 45 connecting the drain electrode 41D of the PMOS 41 and the drain electrode 421 of the NMOS 42. The source electrode 41S of the PMOS 41 is electrically connected to a power source 46. The source electrode 42S of the NMOS 42 is electrically connected to the ground. The control circuit 40 is turned on based on one or more signals applied to at least one of the gate electrode 41G of the PMOS 41 or the gate electrode 42G of the NMOS 42.

FIG. 5 illustrates a schematic diagram of an exemplary control circuit 50, in accordance with some embodiments of the present disclosure. The control circuit 50 includes one transistor of first type and one transistor of second type. The control circuit 50 comprises a PMOS 51 and an NMOS 52. The gate electrode 51G of the PMOS 51 is electrically connected to the gate electrode 52G of the NMOS 52. The drain electrode 51D of the PMOS 51 is electrically connected to the drain electrode 52D of the NMOS 52. The gate electrodes 51G and 52G of the PMOS 51 and NMOS 52 are further electrically connected to the drain electrodes 51D and 52D of the PMOS 51 and the NMOS 52. The output of the control circuit 50 is the node 53 connecting the two drain electrodes 51D and 52D and the two gate electrodes 51G and 52G of the PMOS 51 and NMOS 52. The source electrode 51S of the PMOS 51 is electrically connected to a power source 54. The source electrode 52S of the NMOS 52 is electrically connected to the ground. The logic state of the node 53 depends on the reaction speeds of the PMOS 51 and NMOS 52. The configuration of the PMOS 51 may be similar to a diode. The configuration of the NMOS 52 may be similar to a diode.

FIG. 6 illustrates a schematic diagram of an exemplary control circuit 60, in accordance with some embodiments of the present disclosure. The control circuit 60 includes two transistors of first type and one transistor of second type. Control circuit 60 shown in FIG. 6 differs from control circuit 50 in FIG. 5 in that the control circuit 60 further comprises one transistor of first type. The control circuit 60 shown in FIG. 6 differs from control circuit 50 in FIG. 5 in that the control circuit 60 comprises an additional PMOS 63. The control circuit 60 comprises a PMOS 61, another PMOS 63, and an NMOS 62. The gate electrode 61G of the PMOS 61 is electrically connected to the gate electrode 62G of the NMOS 62. The drain electrode 61D of the PMOS 61 is electrically connected to the drain electrode 62D of the NMOS 62. The gate electrodes 61G and 62G of the PMOS 61 and NMOS 62 are further electrically connected to the drain electrodes 61D and 62D of the PMOS 61 and the NMOS 62. The output of the control circuit 60 is the node 64 connecting the two drain electrodes 61D and 62D and the two gate electrodes 61G and 62G of the PMOS 61 and NMOS 62. The source electrode 61S of the PMOS 61 is electrically connected to the drain electrode 63D of the PMOS 63. The gate electrode 63G of the PMOS 63 is electrically connected to a signal 65. The source electrode 63S of the PMOS 63 is electrically connected to a power source 66. The source electrode 62S of the NMOS 62 is electrically connected to the ground. The control circuit 60 is turned on based on the signal 65 applied to the gate electrode 63G of the PMOS 63. The configuration of the PMOS 61 may be similar to a diode. The configuration of the NMOS 62 may be similar to a diode.

FIG. 7 illustrates a schematic diagram of an exemplary control circuit 70, in accordance with some embodiments of the present disclosure. The control circuit 70 includes one transistor of first type and two transistors of second type. The control circuit 70 shown in FIG. 7 differs from control circuit 50 in FIG. 5 in that the control circuit 70 further comprises one transistor of second type. The control circuit 70 shown in FIG. 7 differs from control circuit 50 in FIG. 5 in that the control circuit 70 comprises an additional NMOS 73. The control circuit 70 comprises a PMOS 71, an NMOS 72, and another NMOS 73. The gate electrode 71G of the PMOS 71 is electrically connected to the gate electrode 72G of the NMOS 72. The drain electrode 71D of the PMOS 71 is electrically connected to the drain electrode 72D of the NMOS 72. The gate electrodes 71G and 72G of the PMOS 71 and NMOS 72 are further electrically connected to the drain electrodes 71D and 72D of the PMOS 71 and the NMOS 72. The output of the control circuit 70 is the node 74 connecting the two drain electrodes 71D and 72D and the two gate electrodes 71G and 72G of the PMOS 71 and NMOS 72. The source electrode 72S of the NMOS 72 is electrically connected to the drain electrode 73D of the NMOS 73. The gate electrode 73G of the NMOS 73 is electrically connected to a signal 75. The source electrode 71S of the PMOS 71 is electrically connected to a power source 76. The source electrode 73S of the NMOS 73 is electrically connected to the ground. The control circuit 14 is turned on based on the signal 75 applied to the gate electrode 73G of the NMOS 73. The configuration of the PMOS 71 may be similar to a diode. The configuration of the NMOS 72 may be similar to a diode.

FIG. 8 illustrates a schematic diagram of an exemplary control circuit 80, in accordance with some embodiments of the present disclosure. The control circuit 80 includes one transistor of first type and one transistor of second type. The control circuit 80 comprises a PMOS 81 and an NMOS 82. The drain electrode 81D of the PMOS 81 is electrically connected to the drain electrode 82D of the NMOS 82. The gate electrode 81G of the PMOS 81 is electrically connected to the drain electrodes 81D of the PMOS 81. The output of the control circuit 80 is the node 83 connecting the two drain electrodes 81D and 82D of the PMOS 81 and NMOS 82 and the gate electrode 81G of the PMOS 81. The gate electrode 82G of the NMOS 82 is electrically connected to a signal 84. The source electrode 81S of the PMOS 81 is electrically connected to a power source 85. The source electrode 82S of the NMOS 82 is electrically connected to the ground. The control circuit 14 is turned on based on the signal 84 applied to the gate electrode 82G of the NMOS 82. The configuration of the PMOS 81 may be similar to a diode.

FIG. 9 illustrates a schematic diagram of an exemplary control circuit 90, in accordance with some embodiments of the present disclosure. The control circuit 90 includes one transistor of first type and one transistor of second type. The control circuit 90 comprises a PMOS 91 and an NMOS 92. The drain electrode 91D of the PMOS 91 is electrically connected to the drain electrode 92D of the MVOS 92. The gate electrode 92G of the NMOS 92 is electrically connected to the drain electrodes 92D of the NMOS 92. The output of the control circuit 90 is the node 93 connecting the two drain electrodes 91D and 92D of the PMOS 91 and NMOS 92 and the gate electrode 92G of the NMOS 92. The gate electrode 91G of the PMOS 91 is electrically connected to a signal 94. The source electrode 91S of the PMOS 91 is electrically connected to a power source 95. The source electrode 92S of the NMOS 92 is electrically connected to the ground. The control circuit 14 is turned on based on the signal 94 applied to the gate electrode 91G of the PMOS 91. The configuration of the NMOS 92 may be similar to a diode.

Figure 10:
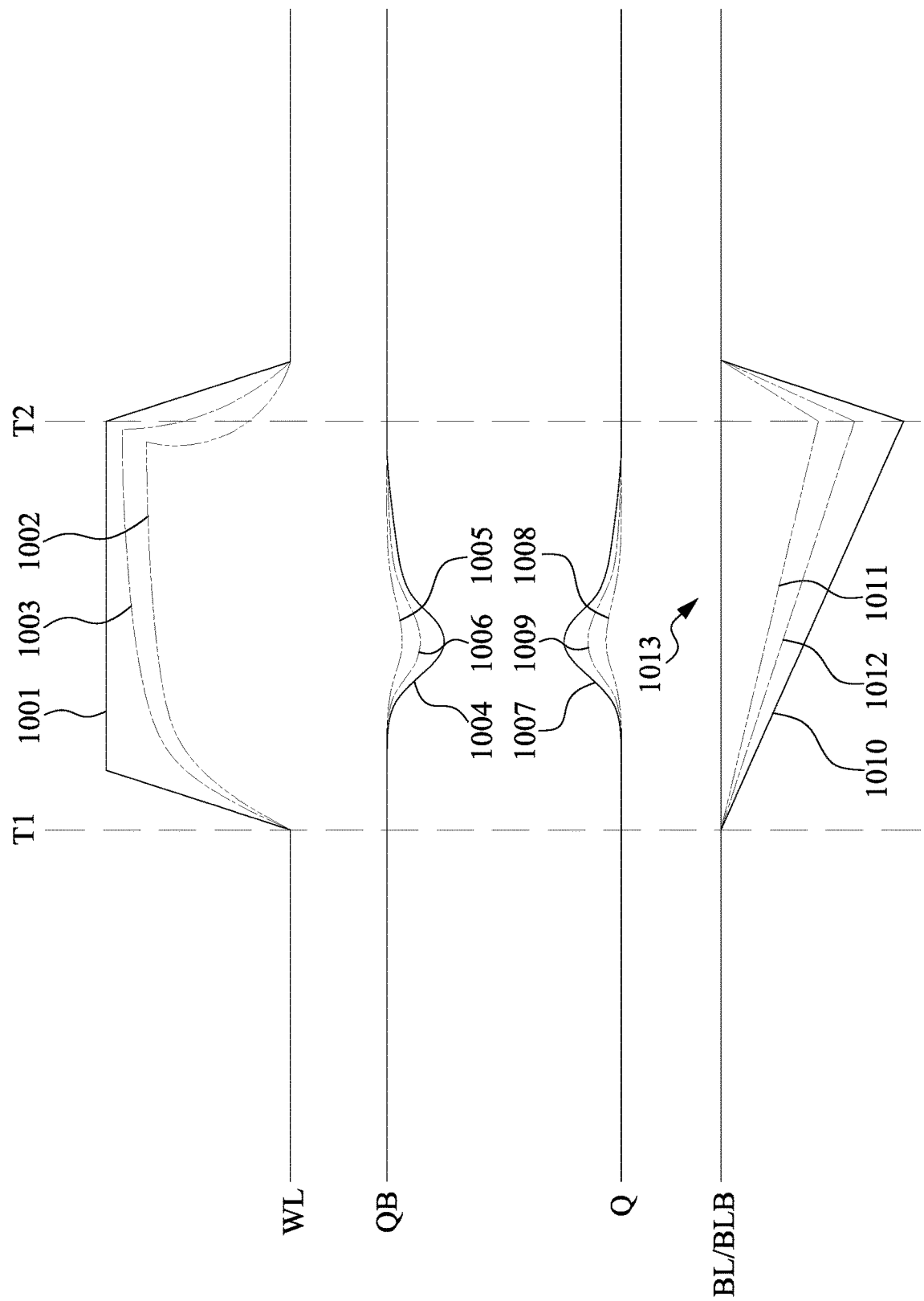
FIG. 10 illustrates exemplary waveforms of different nodes of an electronic device, in accordance with some embodiments of the present disclosure.

FIG. 10 illustrates exemplary waveforms of different nodes of an electronic device, in accordance with some embodiments of the present disclosure. The waveforms shown in FIG. 10 may be measured from a memory device (e.g., the SRAM device 15) or a memory cell (e.g., the SRAM bit-cell 20). Line 1001 shown in FIG. 10 illustrates the waveform of the word line (WL) 21 in FIG. 2. Line 1004 shown in FIG. 10 illustrates the waveform of the node QB in FIG. 2. Line 1007 shown in FIG. 10 illustrates the waveform of the node Q in FIG. 2. Line 1010 shown in FIG. 10 illustrates the waveform of the bit line (BL) 22 in FIG. 2. Line 1013 shown in FIG. 10 illustrates the waveform of the bit line bar (BLB) 22' in FIG. 2.

In some embodiments, the NMOS 33 is weaker and the PMOS 32 is stronger (i.e., slow NMOS fast PMOS (SF) corner). FIG. 10 illustrates a condition of reading data "0" in the SRAM bit-cell 20. When a read operation is performed at a timing T1, the voltage of the word line 11 is pulled up, as shown in line 1001. After pulling-up the voltage of the word line 11, a voltage bump may occur at the node Q, as shown in line 1007. At the same time, a voltage drop may occur at the node QB, as shown in line 1004. Before timing T1, the bit line 22 is set to data "1" (as shown in line 1010), and bit line bar 22' is set to data "1" (as shown in line 1013). When the voltage of the word line 11 is pulled up from the timing T1, the voltage of the bit line 22 starts to drop to a "low" logic state (data "0"), as shown in line 1010. The voltage of the bit line bar 22' remains the same (data "1"), as shown in line 1013. When the read operation is finished at timing T2, the voltage of the word line 11 is pulled down, as shown in line 1001. At the same time, the voltage of the bit line 22 is pulled up to a "high" logic state (data "1"), as shown in line 1010. The voltage of the bit line bar 22' remains the same (data "1"), as shown in line 1013.

Line 1002 shown in FIG. 10 illustrates the waveform of the word line 21 in FIG. 2 cooperating with the suppression circuit 13. Line 1005 shown in FIG. 10 illustrates the waveform of the node QB in FIG. 2 cooperating with the suppression circuit 13. Line 1008 shown in FIG. 10 illustrates the waveform of the node Q in FIG. 2 cooperating with the suppression circuit 13. Line 1011 shown in FIG. 10 illustrates the waveform of the bit line 22 in FIG. 2 cooperating with the suppression circuit 13.

If the suppression circuit 13 is used for the SRAM bit-cell 20 shown in FIG. 2, the peak amplitude of the word line 11 of the SRAM bit-cell 20 with the suppression circuit 13 (as shown in line 1002) is less than that without the suppression circuit 13 (as shown in line 1001). Similarly, the voltage spike of the node Q of the SRAM bit-cell 20 with the suppression circuit 13 (as shown in line 1008) is less than that without the suppression circuit 13 (as shown in line 1007). The voltage drop of the node QB of the SRAM bit-cell 20 with the suppression circuit 13 (as shown in line 1005) is less than that without the suppression circuit 13 (as shown in line 1004). The voltage drop of the bit line 22 of the SRAM bit-cell 20 with the suppression circuit 13 (as shown in line 1011) is less than that without the suppression circuit 13 (as shown in line 1010).

However, if the voltage drop of the word line 11 is excessive, the word line may be not in a "high" logic state during the read operation, and thus the read operation fails. If the voltage drop of the word line 11 is excessive, the power consumption due to the voltage drop may be too much. If the voltage drop of the word line 11 is excessive, the speed of the memory device may be impaired.

Line 1003 shown in FIG. 10 illustrates the waveform of the word line 21 in FIG. 2 cooperating with the suppression circuit 13 and the control circuit 14. Line 1006 shown in FIG. 10 illustrates the waveform of the node QB in FIG. 2 cooperating with the suppression circuit 13 and the control circuit 14. Line 1009 shown in FIG. 10 illustrates the waveform of the node Q in FIG. 2 cooperating with the suppression circuit 13 and the control circuit 14. Line 1012 shown in FIG. 10 illustrates the waveform of the bit line 22 in FIG. 2 cooperating with the suppression circuit 13 and the control circuit 14.

If the suppression circuit 13 and the control circuit 14 may be used for the SRAM bit-cell 20 shown in FIG. 2, the peak amplitude of the word line 11 of the SRAM bit-cell 20 with the suppression circuit 13 and control circuit 14 (as shown in line 1003) is less than that without the suppression circuit 13 (as shown in line 1001). The peak amplitude of the word line 11 of the SRAM bit-cell 20 with the suppression circuit 13 and control circuit 14 (as shown in line 1003) exceeds that with only the suppression circuit 13 (as shown in line 1002). The control circuit 14 can control the voltage drop in the voltage of the word line. The control circuit 14 can keep the word line in a "high" logic state during the read operation. Thus, the read operation will not fail. If the voltage drop of the word line 11 is adequate, the power consumption due to the voltage drop may be controlled. If the voltage drop of the word line 11 is adequate, the speed of the memory device may be maintained.

Similarly, the voltage spike of the node Q of the SRAM bit-cell 20 with the suppression circuit 13 and control circuit 14 (as shown in line 1009) is less than that without the suppression circuit 13 (as shown in line 1007). The voltage spike of the node Q of the SRAM bit-cell 20 with the suppression circuit 13 and control circuit 14 (as shown in line 1009) is larger than that with only the suppression circuit 13 (as shown in line 1008).

The voltage drop of the node QB of the SRAM bit-cell 20 with the suppression circuit 13 and control circuit 14 (as shown in line 1006) is less than that without the suppression circuit 13 (as shown in line 1004). The voltage drop of the node QB of the SRAM bit-cell 20 with the suppression circuit 13 and control circuit 14 (as shown in line 1006) is larger than that with only the suppression circuit 13 (as shown in line 1005).

The voltage drop of the bit line 22 of the SRAM bit-cell 20 with the suppression circuit 13 and control circuit 14 (as shown in line 1012) is less than that without the suppression circuit 13 (as shown in line 1010). The voltage drop of the bit line 22 of the SRAM bit-cell 20 with the suppression circuit 13 and control circuit 14 (as shown in line 1012) is larger than that with only the suppression circuit 13 (as shown in line 1011).

Figure 11:
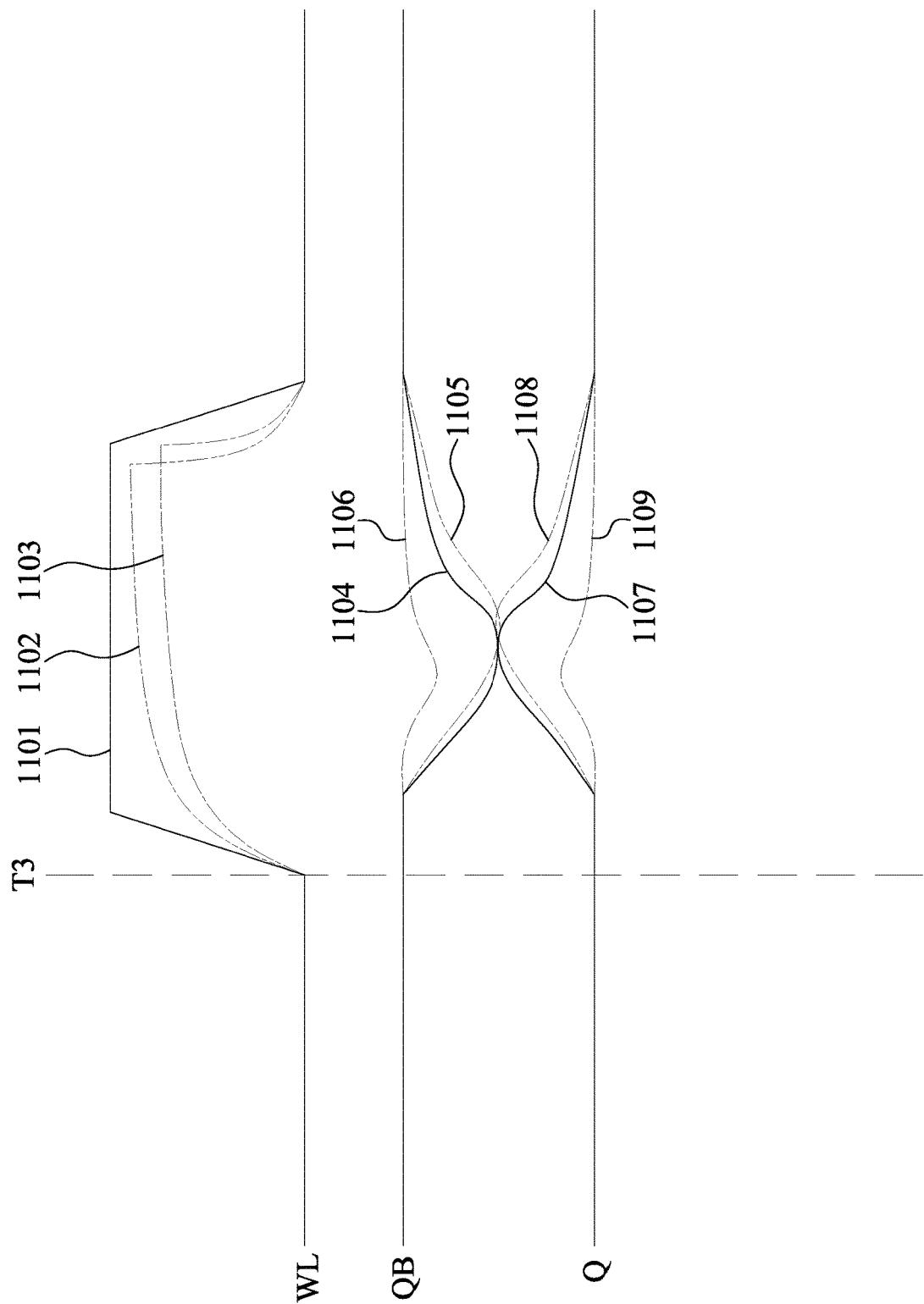
FIG. 11 illustrates exemplary waveforms of different nodes of an electronic device, in accordance with some embodiments of the present disclosure.

FIG. 11 illustrates exemplary waveforms of different nodes of an electronic device, in accordance with some embodiments of the present disclosure. The waveforms shown in FIG. 11 may be measured from a memory device (e.g., the SRAM device 15) or a memory cell (e.g., the SRAM bit-cell 20). Line 1101 shown in FIG. 11 illustrates the waveform of the word line 21 in FIG. 2. Line 1104 shown in 11 illustrates the waveform of the node QB in FIG. 2. Line 1107 shown in FIG. 11 illustrates the waveform of the node Q in FIG. 2.

In some embodiments, the NMOS 33 is stronger and the PMOS 32 is weaker (i.e., fast NMOS slow PMOS (FS) corner). FIG. 11 illustrates a condition of reading data "0" in the SRAM bit-cell 20. When a read operation is performed at timing T3, the voltage of the word line 11 is pulled up, as shown in line 1101. After pulling-up the voltage of the word line, a voltage bump may occur at the node Q, as shown in line 1107. At the same time, a voltage drop may occur at the node QB, as shown in line 1104.

Line 1102 shown in FIG. 11 illustrates the waveform of the word line 21 in FIG. 2 cooperating with the suppression circuit 13. Line 1105 shown in FIG. 11 illustrates the waveform of the node QB in FIG. 2 cooperating with the suppression circuit 13. Line 1108 shown in FIG. 11 illustrates the waveform of the node Q in FIG. 2 cooperating with the suppression circuit 13.

If the suppression circuit 13 is used for the SRAM bit-cell 20 shown in FIG. 2, the peak amplitude of the word line 11 of the SRAM bit-cell 20 with the suppression circuit 13 (as shown in line 1102) is less than that without the suppression circuit 13 (as shown in line 1101). The voltage spike of the node Q of the SRAM bit-cell 20 with the suppression circuit 13 (as shown in line 1108) is almost the same as that without the suppression circuit 13 (as shown in line 1107). The voltage drop of the node QB of the SRAM bit-cell 20 with the suppression circuit 13 (as shown in line 1105) is almost the same as that without the suppression circuit 13 (as shown in line 1104).

Due to process variations, the voltage spike generated at the node Q may be sufficient to cause the data stored at the node Q to be erroneously read as "0" to "1." The voltage drop generated at the node QB may be sufficient to cause the data stored at the node QB to be erroneously read as "1" to "0." This may cause the data stored in the SRAM bit-cell 20 to flip. The data stored in the nodes Q and QB is sensitive to the process variations of manufacturing the SRAM bit-cell 20. The SRAM bit-cell 20 with only the suppression circuit 13 exhibits reduced process variation adaptability.

Line 1103 shown in FIG. 11 illustrates the waveform of the word line 21 in FIG. 2 cooperating with the suppression circuit 13 and the control circuit 14. Line 1106 shown in FIG. 11 illustrates the waveform of the node QB in FIG. 2 cooperating with the suppression circuit 13 and the control circuit 14. Line 1109 shown in FIG. 11 illustrates the waveform of the node Q in FIG. 2 cooperating with the suppression circuit 13 and the control circuit 14.

If the suppression circuit 13 and the control circuit 14 are both used for the SRAM bit-cell 20 shown in FIG. 2, the peak amplitude of the word line 11 of the SRAM bit-cell 20 with the suppression circuit 13 and control circuit 14 (as shown in line 1103) is less than that without the suppression circuit 13 (as shown in line 1101). The peak amplitude of the word line 11 of the SRAM bit-cell 20 with the suppression circuit 13 and control circuit 14 (as shown in line 1103) is less than that with only the suppression circuit 13 (as shown in line 1102).

The voltage spike of the node Q of the SRAM bit-cell 20 with the suppression circuit 13 and control circuit 14 (as shown in line 1109) is less than that without the suppression circuit 13 (as shown in line 1107). The voltage spike of the node Q of the SRAM bit-cell 20 with the suppression circuit 13 and control circuit 14 (as shown in line 1109) is less than that with only the suppression circuit 13 (as shown in line 1108).

The voltage drop of the node QB of the SRAM bit-cell 20 with the suppression circuit 13 and control circuit 14 (as shown in line 1106) is less than that without the suppression circuit 13 (as shown in line 1104). The voltage drop of the node QB of the SRAM bit-cell 20 with the suppression circuit 13 and control circuit 14 (as shown in line 1106) is less than that with only the suppression circuit 13 (as shown in line 1105).

The voltage spike generated at the node Q is controlled to avoid causing data stored at the node Q to be misread as "0" to "1." The voltage drop generated at the node QB may be controlled to avoid causing the data stored at the node QB to be misread as "1" to "0." Thus the data stored in the SRAM bit-cell 20 may not be flipped. The SRAM bit-cell 20 with the suppression circuit 13 and control circuit 14 has better process variation adaptability than that without the suppression circuit 13. The SRAM bit-cell 20 with the suppression circuit 13 and control circuit 14 also has better process variation adaptability than that with only the suppression circuit 13.

Figure 12:
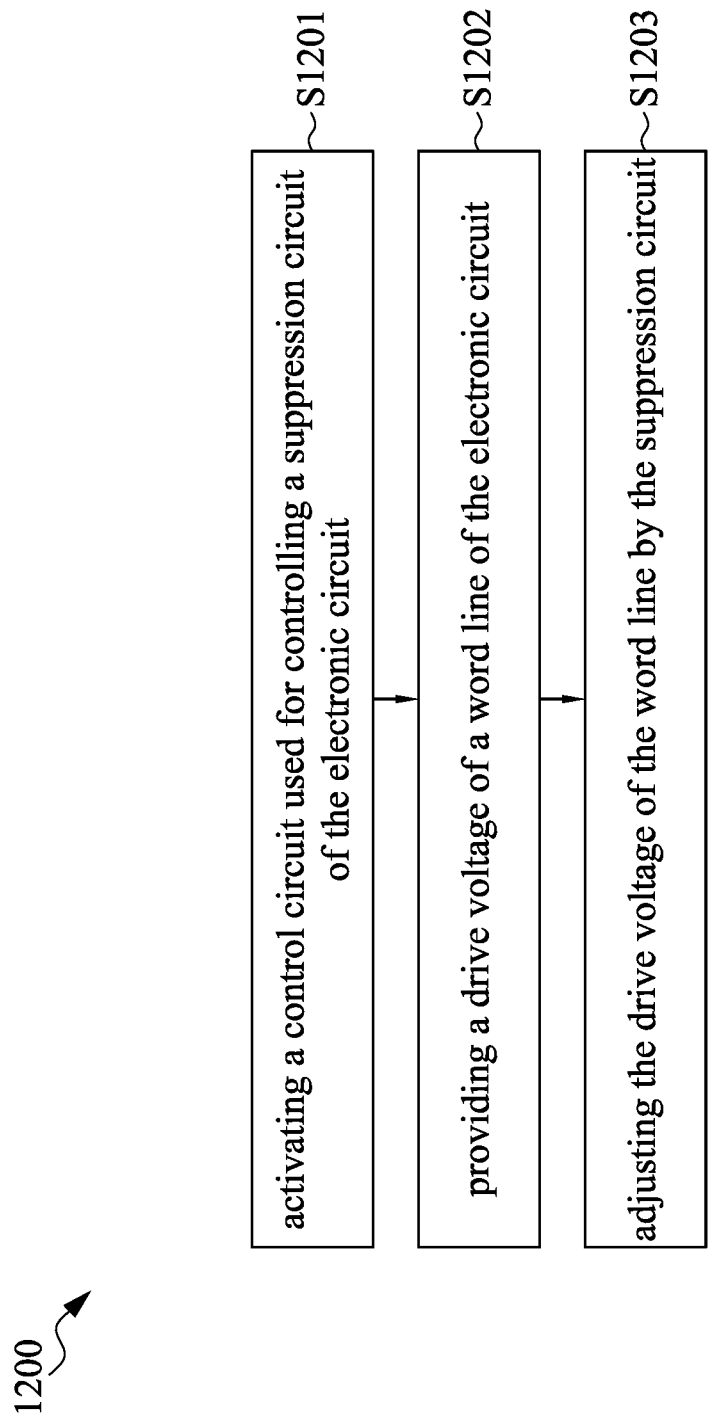
FIG. 12 is a flowchart of a method for operating an electronic device, in accordance with various aspects of the present disclosure.

FIG. 12 is a flowchart of a method 1200 for operating an electronic circuit, in accordance with various aspects of the present disclosure.

The method 1200 begins with operation S1201 in which a control circuit is activated to control a suppression circuit of the electronic circuit. Referring back to FIG. 1, the control circuit 14 can control the suppression circuit 13 of the electronic device 1.

The method 1200 continues with operation S1202 in which a drive voltage of a word line of the electronic circuit is provided. Referring back to FIG. 1, a drive voltage of the word line 11 of the electronic device 1 is provided to the SRAM bit-cell 20.

The method 1200 continues with operation S1203 in which the drive voltage of the word line is adjusted by the suppression circuit. Referring back to FIG. 1, the suppression circuit 13 can adjust the drive voltage of the word line 11 input to the SRAM bit-cell 20.

In some embodiments, the control circuit is activated by one or more input signals. Referring back to FIG. 3, the control circuit 14 is activated by one or more input signals 35 and 36. In some embodiments, the control circuit 14 controls the suppression circuit 13. The suppression circuit 13 controls the voltage drop generated to the voltage of the word line 11. The voltage of the word line 11 is adjusted by the suppression circuit 13 and then input to the SRAM bit-cell 20.

In some embodiments, the control circuit comprises a first transistor of the first type (PMOS) and a second transistor of a second type (NMOS). The control circuit generates a control voltage based on a voltage difference caused by the first transistor and a voltage difference caused by the second transistor. With reference back to FIG. 3, the control circuit 14 comprises a first transistor 32 of the first type (PMOS) and a second transistor 33 of a second type (NMOS). The control circuit 13 generates a control voltage based on a voltage difference caused by the first transistor 32 and a voltage difference caused by the second transistor 33.

In some embodiments, the suppression circuit decreases the drive voltage of the word line based on the control voltage. With reference back to FIGS. 3 and 10, the suppression circuit 13 generates a voltage drop to the voltage of the word line and thus decreases the drive voltage of the word line 11 based on the control voltage input to the suppression circuit 13.

The method 1200 is merely an example, and is not intended to limit the present disclosure beyond what is explicitly recited in the claims. Additional operations can be provided before, during, or after each operations of the method 1200, and some operations described can be replaced, eliminated, or moved around for additional embodiments of the method. In some embodiments, the method 1200 can include further operations not depicted in FIG. 12.

Some embodiments of the present disclosure provide an electronic circuit. The electronic circuit comprises a driver circuit configured to provide a drive voltage to a word line of the electronic circuit, a suppression circuit electrically connected to the driver circuit and the word line, and a control circuit electrically connected to the suppression circuit. The suppression circuit is configured to generate a voltage drop in the drive voltage. The control circuit controls the suppression circuit.

Some embodiments of the present disclosure provide a static random access memory (SRAM). The SRAM comprises a word line, a bit line, a bit line bar, a first inverter formed by a first transistor and a second transistor, a second inverter formed by a third transistor and a fourth transistor, a first node (QB) connected to a drain electrode of the first transistor and a drain electrode of the second transistor, a second node (Q) connected to a drain electrode of the third transistor and a drain electrode of the fourth transistor, a first control transistor electrically connected to the word line, the first inverter, and the bit line bar, a second control transistor electrically connected to the word line, the second inverter, and the bit line, a suppression circuit electrically connected to the word line, and a control circuit electrically connected to the suppression circuit. The suppression circuit is configured to generate a voltage drop in a drive voltage of the word line. The control circuit controls the suppression circuit to generate the voltage drop.

Some embodiments of the present disclosure provide a method for operating an electronic circuit. The method comprises activating a control circuit used for controlling a suppression circuit of the electronic circuit, providing a drive voltage of a word line of the electronic circuit, and adjusting the drive voltage of the word line by the suppression circuit.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic circuit, comprising:
    a driver circuit configured to provide a drive voltage to a word line of the electronic circuit;
    a suppression circuit electrically connected to the driver circuit and the word line, the suppression circuit configured to generate a voltage drop in the drive voltage;
    a control circuit electrically connected to the suppression circuit, wherein the control circuit controls the suppression circuit,
    wherein the suppression circuit comprises a first transistor of a first type (PMOS), and wherein a source electrode and a drain electrode of the first transistor are electrically connected between the word line and the ground,
    wherein the control circuit comprises a second transistor of the first type (PMOS) and a third transistor of a second type (NMOS), and wherein a gate electrode of the second transistor is separated from a gate electrode of the third transistor,
    wherein a first signal input to the gate electrode of the second transistor is different from a second signal input to the gate electrode of the third transistor.

2. The electronic circuit of claim 1, wherein an amount of the voltage drop is determined based on a control voltage applied to a gate electrode of the first transistor.

3. The electronic circuit of claim 1, wherein the gate electrode of the first transistor is connected to a drain electrode of the second transistor and a drain electrode of the third transistor.

4. The electronic circuit of claim 3, wherein the control voltage applied to the gate electrode of the first transistor is determined based on a voltage difference caused by the second transistor and a voltage difference caused by the third transistor.

5. The electronic circuit of claim 3, wherein the control circuit is turned on based on one or more signals applied to at least one of a gate electrode of the second transistor or a gate electrode of the third transistor.

6. The electronic circuit of claim 5, wherein the gate electrode of the second transistor is electrically connected to the drain electrode of the second transistor, and the control circuit is turned on based on a signal applied to the gate electrode of the third transistor.

7. The electronic circuit of claim 5, wherein the gate electrode of the third transistor is electrically connected to the drain electrode of the third transistor, and the control circuit is turned on based on a signal applied to the gate electrode of the second transistor.

8. The electronic circuit of claim 1, wherein the first transistor is turned off when the first signal is subject to a high voltage and the second signal is subject to a low voltage.

9. The electronic circuit of claim 1, wherein the control circuit is turned on based on one or more signals applied to at least one of the gate electrode of the second transistor or the gate electrode of the third transistor.

10. A static random access memory (SRAM) device, comprising:
   a word line;
   a bit line;
   a bit line bar;
   a first inverter formed by a first transistor and a second transistor;
   a second inverter formed by a third transistor and a fourth transistor;
   a first node connected to a drain electrode of the first transistor and a drain electrode of the second transistor;
   a second node connected to a drain electrode of the third transistor and a drain electrode of the fourth transistor
   a first control transistor electrically connected to the word line, the first inverter, and the bit line bar;
   a second control transistor electrically connected to the word line, the second inverter, and the bit line;
   a suppression circuit electrically connected to the word line, the suppression circuit configured to generate a voltage drop in a drive voltage of the word line, wherein the suppression circuit comprises a fifth transistor of a first type (PMOS), and wherein a source electrode and a drain electrode of the fifth transistor are electrically connected between the word line and the ground; and
   a control circuit electrically connected to the suppression circuit, wherein the control circuit controls the suppression circuit to generate the voltage drop,
   wherein the control circuit comprises a sixth transistor of the first type (PMOS) and a seventh transistor of a second type (NMOS), and wherein a gate electrode of the sixth transistor is separated from a gate electrode of the seventh transistor,
   wherein a first signal input to the gate electrode of the sixth transistor is different from a second signal input to the gate electrode of the seventh transistor.

11. The SRAM device of claim 10, wherein an amount of the voltage drop is determined based on a control voltage applied to a gate electrode of the fifth transistor.

12. The SRAM device of claim 11, wherein the gate electrode of the fifth transistor is connected to a drain electrode of the sixth transistor and a drain electrode of the seventh transistor.

13. The SRAM device of claim 12, wherein the control voltage applied to the gate electrode of the fifth transistor is determined based on a voltage difference caused by the sixth transistor and a voltage difference caused by the seventh transistor.

14. The SRAM device of claim 12, wherein the control circuit is turned on based on one or more signals applied to at least one of a gate electrode of the sixth transistor or a gate electrode of the seventh transistor.

15. The SRAM device of claim 10, wherein the fifth transistor is turned off when the first signal is subject to a high voltage and the second signal is subject to a low voltage.

16. A method for operating an electronic circuit, comprising:
   activating a control circuit used for controlling a suppression circuit of the electronic circuit, wherein the suppression circuit comprises a first transistor of a first type (PMOS), and wherein a source electrode and a drain electrode of the first transistor are electrically connected between the word line and the ground, wherein the control circuit comprises a second transistor of the first type (PMOS) and a third transistor of a second type (NMOS), wherein a gate electrode of the second transistor is separated from a gate electrode of the third transistor, and wherein a first signal input to the gate electrode of the second transistor is different from a second signal input to the gate electrode of the third transistor;
   providing a drive voltage of a word line of the electronic circuit; and
   adjusting the drive voltage of the word line by the suppression circuit.

17. The method of claim 16, wherein the control circuit is activated by one or more input signals.

18. The method of claim 16, wherein the control circuit generates a control voltage based on a voltage difference caused by the second transistor and a voltage difference caused by the third transistor.

19. The method of claim 18, wherein the suppression circuit decreases the drive voltage of the word line based on the control voltage.

20. The method of claim 16, wherein the first transistor is turned off when the first signal is subject to a high voltage and the second signal is subject to a low voltage.

* * * * *